United States Patent [19]

Sheng et al.

[11] 4,438,450
[45] Mar. 20, 1984

[54] SOLID STATE DEVICE WITH CONDUCTORS HAVING CHAIN-SHAPED GRAIN STRUCTURE

[75] Inventors: Tan T. Sheng, Berkeley Heights; Ashok K. Sinha; Sheila Vaidya, both of New Providence, all of N.J.

[73] Assignee: Bell Telephone Laboratories, Incorporated, Murray Hill, N.J.

[21] Appl. No.: 328,149

[22] Filed: Dec. 7, 1981

Related U.S. Application Data

[63] Continuation of Ser. No. 98,979, Nov. 30, 1979, abandoned.

[51] Int. Cl.³ .................. H01L 23/48; H01L 29/44; H01L 29/46; H01L 29/62
[52] U.S. Cl. ........................................ 357/68; 357/65; 357/67; 357/71
[58] Field of Search ............... 357/67, 65, 68, 71

[56] References Cited

U.S. PATENT DOCUMENTS

| | | | |
|---|---|---|---|
| 2,168,135 | 8/1939 | Pavelka | 361/433 |
| 3,743,894 | 7/1973 | Hall et al. | 357/67 |
| 3,754,168 | 8/1973 | Cunningham et al. | 357/67 |
| 3,830,657 | 8/1974 | Farrar | 357/67 |
| 3,833,842 | 9/1974 | Cunningham et al. | 357/67 |
| 3,879,840 | 4/1975 | Ames et al. | 357/67 |
| 4,017,890 | 4/1977 | Howard et al. | 357/67 |
| 4,027,326 | 5/1977 | Kummer et al. | 357/67 |
| 4,166,279 | 8/1979 | Gangulee | 357/67 |
| 4,352,239 | 10/1982 | Pierce | 357/68 X |

OTHER PUBLICATIONS

IBM Technical Disclosure Bulletin; Aluminum Land Metallurgy with Copper on the Surface; by Daley, vol. 13, No. 6, Nov. 1970, p. 1735.
IBM Technical Disclosure Bulletin; Improving the Resistance to Electromigration of Al-Cu Stripes; by D'Heurle; vol. 13, No. 9, Feb. 1971, p. 2492.
IBM Technical Disclosure Bulletin; Reduced Electromigration Damage in Al-Cu Stripes; by Rosenberg; vol. 13, No. 12, May 1971, pp. 3826+3827.

*Primary Examiner*—Andrew J. James
*Assistant Examiner*—Seth Nehrbass
*Attorney, Agent, or Firm*—Herbert M. Shapiro

[57] ABSTRACT

Aluminum electrically conducting patterns for integrated circuits are achieved with narrow lines and unexpectedly-high electromigration characteristics by making the crystal grains of the pattern into a chain-shaped structure with {111} orientation. A process for achieving the structure is also described.

6 Claims, 9 Drawing Figures

1·1 mm (45 THOU.)

SOLID STATE DEVICE WITH CONDUCTORS HAVING CHAIN-SHAPED GRAIN STRUCTURE

FIELD OF THE INVENTION

This application is a continuation of application Ser. No. 098,979, filed Nov. 30, 1979, now abandoned.

BACKGROUND OF THE INVENTION

One of the limitations to the realization of very dense semiconductor integrated circuit arises from the fact that aluminum and aluminum alloy electrical conductors, which are required to carry high currents, develop open circuit conditions during use even after testing. These open circuit problems have been attributed to electromigration-induced failures as is now well understood in the art. Electromigration damage has been found to be held to tolerable limits if conductor widths are held to seven microns or greater for current density levels required by practical devices. But such a limitation constrains the effort to reach higher and higher packing densities.

Conductor width dependence of electromigration life in Al-Cu, Al-Cu-Si, and Ag conductors is discussed in an article, so entitled by G. A. Scoggan, B. N. Agarwala, P. P. Peressini, and A. Brouillard appearing on page 151 in *The Proceedings of the 13th Reliability Physics Symposium, IEEE*, New York, 1975, page 151. That reference describes the effect of varying grain size and line width on lifetime and illustrates that as the conductor line width is decreased the electromigration lifetime approaches a saturation level or even exhibits a weak minimum. Thus it concludes that large grain size leads to improved lifetimes for short, narrow lines. On the other hand, it is clear from the publication that lines even as narrow as one micron would contain structural defects or divergent sites causing electromigration failures. Consequently, even lines with large grain size are limited in their usable lengths. The above-mentioned publication notes also the desirability of an ideal bamboo or chain geometry for the grain structure in electrical conductors. The *Journal of Applied Physics*, Vol. 41, No. 10, Sept. 1970, at page 3954 et seq. documents the decreasing electromigration life with increasing length. Therefore, the combination of long lines (>1 cm) with narrow widths presents a formidable obstacle to the use of fine-line Al.

The present invention is directed at the problem of achieving fine-line width conductor patterns with markedly improved resistance to electromigration related open circuits.

BRIEF DESCRIPTION OF THE INVENTION

An aluminum or aluminum alloy electrical conductor pattern with one micron line width and length of one centimeter or more and characterized by commercially attractive electromigration properties is achieved herein by a process which produces grains essentially all oriented so that the {111} crystal plane is in the plane of the deposition surface. In an illustrative embodiment, a SiO$_2$ layer is formed on a silicon substrate by heating the substrate in an oxidizing atmosphere. Next a layer of, for example, Al ½% Cu is deposited by e-gun evaporation. The pattern is formed by etching through a mask with BCl$_3$+Cl$_2$ (10% by volume) in a glow discharge plasma. Thereafter, the pattern is annealed in hydrogen at 450 degrees C. for one-half hour. The resulting pattern is characterized by a chain-like grain structure, having grains most of which are oriented with {111} axis perpendicular to the plane of the deposition surface.

DETAILED DESCRIPTION

Figure 1:
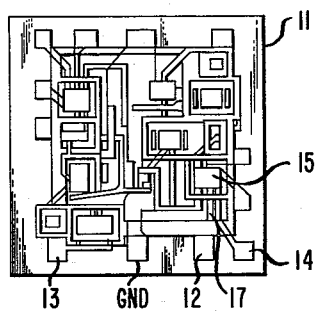
FIG. 1 is a schematic plan view of an illustrative integrated circuit in accordance with this invention.

FIG. 1 shows a typical commercial integrated circuit 10 defined in a chip 11 of semiconductor material such as silicon. The circuit includes a pattern of electrically conducting material extending between active semiconductor regions and lands to which external electrical connections are made. Illustrative lands are designated 12, 13, 14 and ground (GND) in the figure. Attention is directed to illustrative conductor 17 extending between land 12 and active region 15.

Figure 2:

FIG. 2 shows a micrograph of the grain structure of a typical conductor 17 of a standard integrated circuit. Such conductors typically are seven microns or greater in commercial circuits. A large number of grains can be seen spanning the conductor width. The grain size in this case clearly is small compared to the width of the conductor.

Figure 3:
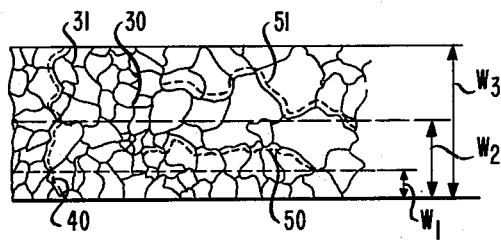
FIGS. 2 and 3 are enlarged top and schematic views respectively of portions of the circuit of FIG. 1.

FIG. 3 shows, schematically, a typical grain pattern which corresponds, for example, to that of conductor 17. Voids usually form at heterogeneities in structure such as, for example, grain boundary triple points, 30 and 31 in FIG. 3, by the electromigration of atoms along the direction of current flow away from these sites. One such path for electromigration, composed of grain boundary segments, may be represented by dotted line 50 in FIG. 3. Another may be represented by dotted line 51. It is clear that with many triple points and many such paths for electromigration, open circuits result fairly easily.

Figure 5:
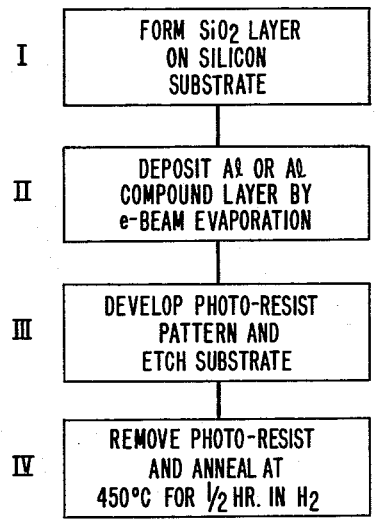
FIG. 5 is a flow diagram of a process for making the device of FIGS. 1-4.
Figure 4:
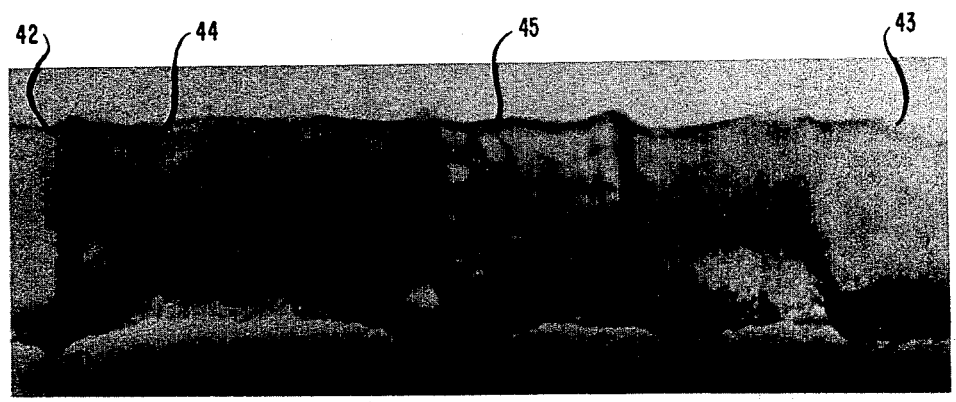
FIG. 4 is an enlarged top view of a portion of the circuit of FIG. 1 made in accordance with this invention.

FIG. 4 is a micrograph of the grain structure of one micron wide electrical conductors such as 17 of FIGS. 1 and 2 achieved by the process of FIG. 5 herein. The grain size is generally larger than the width of the conductor. Some of these grains are designated 42, 43, 44 and 45 in FIG. 4. Clearly, no triple points exist. In addition, there are no grain boundary heterogeneities which could contribute to void formation and failure. A thin film conductor pattern characterized by a chain type grain structure would approach an ideal (bamboo) structure as far as electromigration characteristics are concerned. Such structures are achieved with lengths suitable for commercial use by the processes of FIG. 5.

The first step of the process is to form an SiO$_2$ layer 0.5 microns (μm) thick on a processed silicon substrate as indicated by block I of FIG. 5. The second step is to deposit Al-0.5% Cu by e-gun evaporation onto a hot surface (approximately 300 degrees C.) as indicated by block II. A photoresist layer is deposited, exposed, developed and etched to form lines of the kind shown in FIG. 2. This step is represented by the block of FIG. 3. The etched pattern is annealed in hydrogen at 450 degrees C. for about one-half hour to form the bamboo structure of the line shown in FIG. 4.

The grains 42, 43, 44, 45 . . . labelled in FIG. 4 are all oriented with the {111} direction perpendicular to the surface of the SiC$_2$ layer. Only with grains in the same direction can lines of the order of a centimeter in length have such attractive electromigration characteristics. The process of FIG. 5 produces the chain structure, the requisite preferred crystal orientation and the resulting attractive characteristics. The e-gun evaporation produces a film with atoms possessing a high degree of mobility for later recrystallization in a preferred direction upon annealing.

Figure 6:
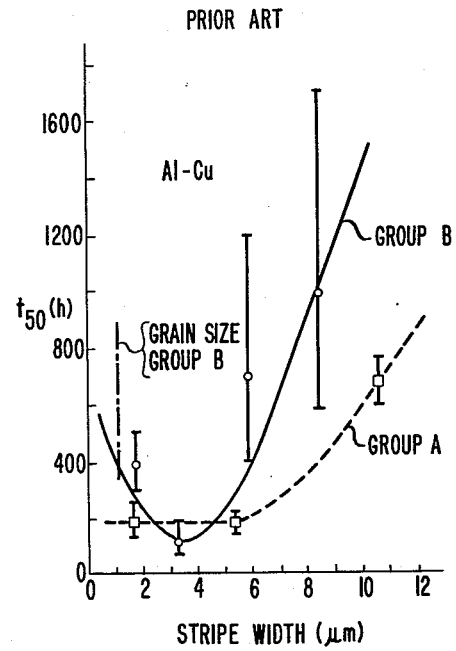
FIG. 6 is a graph of the electromigration characteristic of prior art circuits.

FIG. 6 shows a prior art plot of stripe width in microns versus lifetime for two groups of materials A and B taken from the above referenced *IEEE Proceedings*. An increase in the characteristic mean time to failure (t$_{50}$) below three micron line width is shown for Group B materials. The grain size for Group B materials is about one micron as indicated in the figure. Improvement seems to be achieved for mean grain sizes of less than the line width as well as about equal to the line width. The reason for the improvement is offered in connection with FIG. 3. Line widths w$_1$, w$_2$ and w$_3$ are indicated by broken lines as seen. A path such as 50 or 51 exists in each of the lines w$_2$ and 2$_3$ for electromigration and resulting void formation. Even in the line of narrow width w$_1$, although single grains may span the entire width of the conductor, a number of divergent sites still occur for void formation.

This is not the case in lines made according to the process of FIG. 5. The cleanliness of the SiO$_2$ surface, the process of metal deposition and the final annealing of the pattern cooperate to achieve the {111} orientation of the grains and also the requisite chain structure. Others who have had a final annealing step in their process for making fine-line structures have not realized the chain structure with a like grain orientation achieved herein. When grains have a common-poled axis, their boundaries are more uniform in properties leading to a reduced number of divergent sites for void growth.

Figure 7:
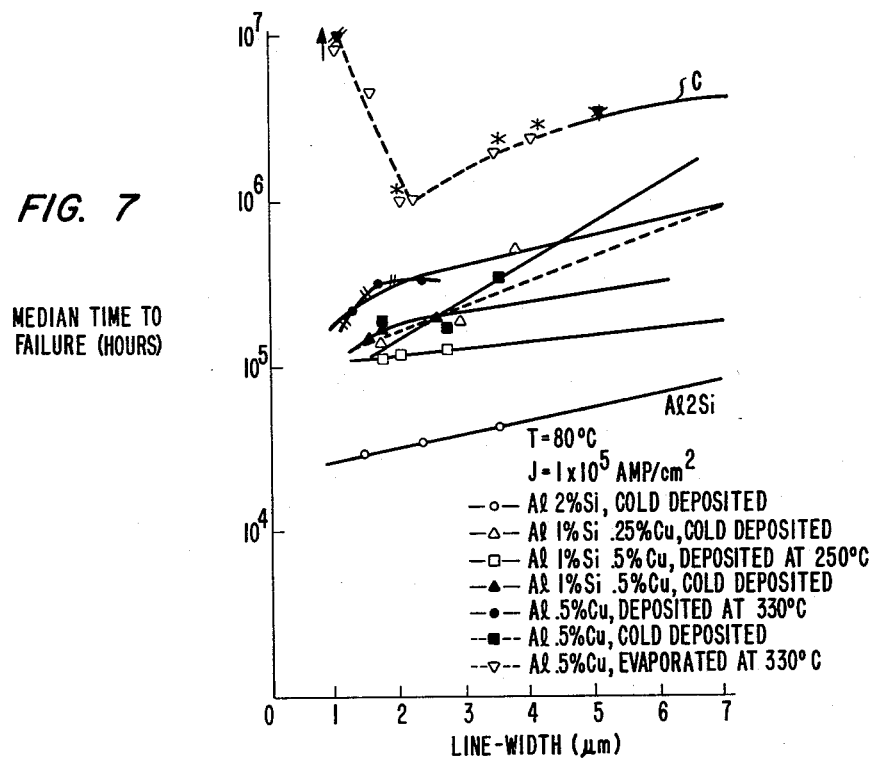
FIG. 7 is a graph of electromigration lifetime data for a variety of deposited Al lines.

FIG. 7 plots mean time to failure versus line width. The improvement achieved herein by lines with bamboo-like structures is represented by curve C in FIG. 7. The remaining lines in the figure represent data taken for different test materials and deposition techniques according to the legend in the figure. Only e-gun evaporated materials showed the improvement represented line C.

Figure 8:
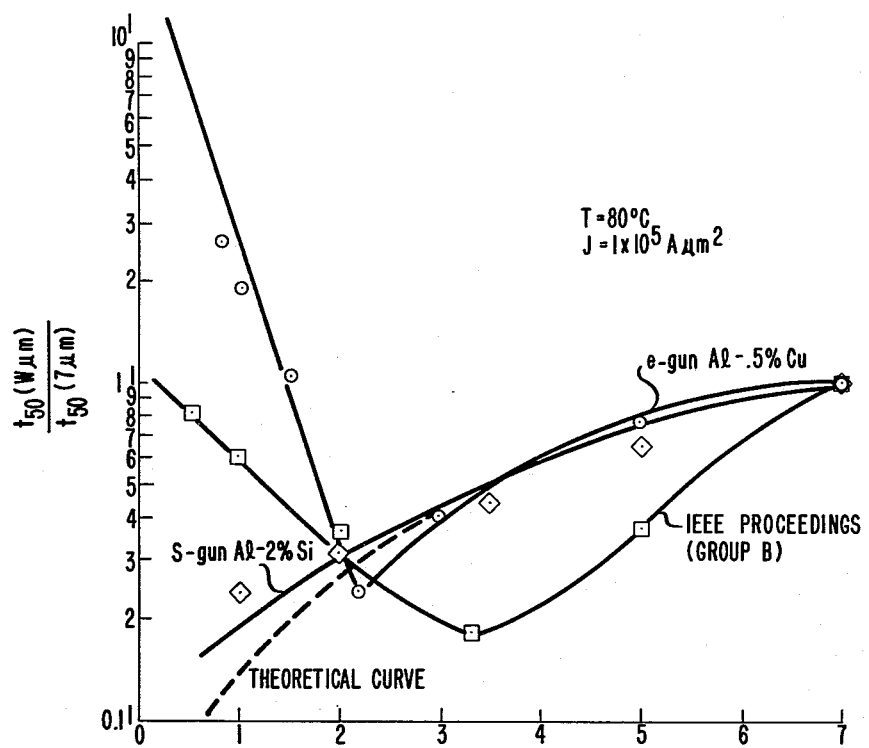
FIG. 8 is a graph of the electromigration characteristics of the circuits of FIGS. 1-4 compared to like prior art circuits.

FIG. 8 is a plot of the ratio of lifetime at width w to that at 7 microns versus line width for prior art lines and for data from experimentation with lines made in accordance with the process of FIG. 5. The plot is similar to that of FIG. 7, but the data is normalized to the lifeline at 7 microns so that all curves go to the value 1 (one) as shown. The curve for Group B materials in FIG. 6 (from the *IEEE Proceedings*) is redrawn in FIG. 8 as indicated. An electromigration lifetime minimum is shown at slightly over three microns with a modest increase for narrower lines. Aluminum deposition by S-gun evaporation approximately follows the theoretical (shown in *The IEEE Reliability Physics Symposium* 1978, at page 233, by J. R. Black) curve so designated in the figure. Lines with like grain orientations were characterized by dramatically high lifetimes at narrow line widths as shown by a representative curve designated "e-gun Al-0.5% Cu". The data for FIG. 8 was determined for nominal device operating conditions of 80 degrees C. and a current density of 1×10$^5$ amperes/cm$^2$.

In one specific test arrangement, lines having widths of 1 micron showed an unexpected and surprisingly large electromigration lifetime of 1×10$^7$ h (hours) at 80 degrees C. and a current density of 1×10$^5$ A/cm$^2$. These lifetimes were estimated from accelerated aging data obtained at 250 degrees C. for a current density of 2×10$^6$ A/cms$^2$ and conservatively assuming a thermal activation energy of 0.5 ev. It was found generally that films with linewidths of 1.5 microns and less had very long lifetimes of 4×10$^6$ h or greater.

Figure 9:
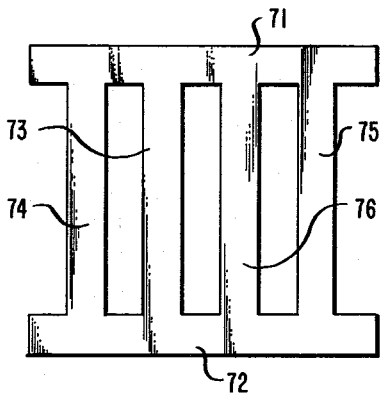
FIG. 9 is a top view of an alternative embodiment in accordance with this invention.

As is also clear from cure C of FIG. 7 (and the e-gun curve of FIG. 8) much higher lifetimes are achieved for narrower lines with chain-shaped grain structures herein than for relatively wide lines. Consequently, an electrically conducting pattern as shown in FIG. 9 is attractive where first and second lands (or one land and an active region) 71 and 72 are interconnected by a plurality 73, 74, 75 and 76, of electrically conducting lines of say one micron width rather than a single line of say seven micron width.

The embodiments described herein are considered merely illustrative of the principles of this invention. Therefore, those skilled in the art can devise various modifications thereof within the spirit and scope of the invention as encompassed by the following claims. For example, although the invention has been described in connection with a {111} grain orientation, like grain orientations other than {111} are possible. A layer of another metal over the SiO$_2$ surface is known in this connection to permit such other orientation.

It is to be clear that the invention may be practiced with other solid state devices such as magnetic bubble devices.

We claim:

1. A solid state device including a first layer having a first surface and a pattern of electrically conducting lines thereon, each of said lines comprising a single layer of like material, each of said single layers comprising a succession of grains forming a chain-shaped structure, each of said grains extending from side to side and from top to bottom of the respective one of said single layers, said line having a length much greater than said width to permit the formation of a significantly long chain of grains therein.

2. A solid state device in accordance with claim 1 wherein said grains are oriented in a {111} direction.

3. A solid state device in accordance with claim 2 wherein said first layer comprises SiO$_2$ and said pattern is made from a class of materials consisting of aluminum and aluminum alloys.

4. A solid state device in accordance with claim 3 wherein said SiO$_2$ layer is formed on a semiconductor substrate.

5. A solid state device in accordance with claim 4 wherein said substrate is silicon.

6. A solid state device in accordance with claim 1 wherein said pattern comprises a land and an active region and a plurality of said lines connected electrically in parallel between said land and active region.

* * * * *